(12) United States Patent
Kim

(10) Patent No.: US 8,198,719 B2
(45) Date of Patent: Jun. 12, 2012

(54) SEMICONDUCTOR CHIP AND SEMICONDUCTOR PACKAGE INCLUDING THE SAME

(75) Inventor: Seong Cheol Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 155 days.

(21) Appl. No.: 12/835,927

(22) Filed: Jul. 14, 2010

(65) Prior Publication Data

US 2011/0121462 A1    May 26, 2011

(30) Foreign Application Priority Data

Nov. 20, 2009  (KR) .................. 10-2009-0112621

(51) Int. Cl.
*H01L 23/04*   (2006.01)
*H01L 23/34*   (2006.01)
*H01L 23/48*   (2006.01)
*H01L 23/52*   (2006.01)

(52) U.S. Cl. ........ 257/686; 257/698; 257/724; 257/774; 257/E23.011; 257/E23.174

(58) Field of Classification Search .................. 257/686, 257/698, 724, 774, E23.011, E23.174
See application file for complete search history.

(56) References Cited

U.S. PATENT DOCUMENTS

| | | | |
|---|---|---|---|
| 2005/0133930 A1* | 6/2005 | Savastisuk et al. | 257/774 |
| 2009/0121323 A1* | 5/2009 | Kwon et al. | 257/621 |
| 2009/0243120 A1* | 10/2009 | Kita et al. | 257/774 |
| 2011/0115097 A1* | 5/2011 | Shau | 257/774 |
| 2011/0163453 A1* | 7/2011 | Akiyama | 257/758 |
| 2011/0215480 A1* | 9/2011 | Gorczyca et al. | 257/774 |
| 2011/0266683 A1* | 11/2011 | Feng | 257/773 |
| 2011/0309519 A1* | 12/2011 | Kim | 257/774 |

\* cited by examiner

*Primary Examiner* — Ngan Ngo

(74) *Attorney, Agent, or Firm* — Ladas & Parry LLP

(57) ABSTRACT

A semiconductor chip includes a semiconductor chip body, a through-silicon via and a silicon pattern. The semiconductor chip body has a first surface and a second surface facing away from the first surface. The through-silicon via is formed to pass through the semiconductor chip body and has a metal layer and an insulation layer which protrude from the second surface. The silicon pattern is formed on a sidewall of the protruding through-silicon via.

18 Claims, 4 Drawing Sheets

SEMICONDUCTOR CHIP AND SEMICONDUCTOR PACKAGE INCLUDING THE SAME

CROSS-REFERENCE TO RELATED APPLICATIONS

The present application claims priority to Korean patent application number 10-2009-0112621 filed on Nov. 20, 2009, which is incorporated herein by reference in its entirety.

BACKGROUND OF THE INVENTION

The present invention relates generally to a semiconductor chip and a semiconductor package including the same, and more particularly, to a semiconductor chip having through-silicon vias and a semiconductor package including the same.

In the semiconductor industry, packaging technologies for integrated circuits are continuously being developed to satisfy the demand toward miniaturization and mounting reliability. For example, the demand toward miniaturization has resulted in the development of techniques for implementing a package with a size approaching that of a chip, and the demand toward mounting reliability has highlighted the importance of packaging techniques for improving the efficiency of mounting work and mechanical and electrical reliability after mounting.

The term "stack" when referred to in the semiconductor industry means to vertically arrange at least two chips or packages. When taking advantage of stacking technology, it is possible to realize a product whose memory capacity is greater than that obtainable solely through semiconductor integration processes, and mounting area utilization efficiency can also be improved.

Stacking technologies are generally divided into a method of stacking individual semiconductor chips and simultaneously packaging the stacked semiconductor chips, and a method of stacking individually packaged semiconductor chips.

In stack packages, examples of bonding methods include a bonding method using metal wires and a bonding method using through-silicon vias (TSVs). Stack packages using the through-silicon vias are considered to overcome certain problems caused in stack packages using metal wires.

When compared to a stack package using metal wires, a stack package in which electrical connections are formed by through-silicon vias is capable of: preventing certain electrical degradation of the stack package, increasing operating speed, and achieving a higher level of miniaturization.

The electrical connections between stacked semiconductor chips are formed by the medium of junction metals which are interposed between exposed portions of through-silicon vias protruding from the lower surface of an upper semiconductor chip and the upper pads of a lower semiconductor chip. The junction metals can include, for example, solders.

However, in the course of electrically connecting the stacked semiconductor chips, unwanted portions of the upper semiconductor chip and the lower semiconductor chip may become electrically short-circuited, whereby electrical short circuits frequently occur.

In more detail, semiconductor chips having through-silicon vias include upper pads that are electrically and physically attached to each other by the medium of the junction metals and a filler material.

The exposed portions of the through-silicon vias of the upper semiconductor chip and the upper pads of the lower semiconductor chip are electrically connected to each other by melting the junction metals interposed therebetween through a reflow process.

When conducting the reflow process, the melted junction metals are likely to flow onto the lower surface of the upper semiconductor chip along the exposed portions of the through-silicon vias, so that the unwanted portions of the upper semiconductor chip and the lower semiconductor chip are electrically short-circuited, whereby electrical short circuits frequently occur. If the short circuits occur, misoperation of the semiconductor chip is caused, whereby the manufacturing yield can markedly decrease.

While a process for applying an insulating material to the lower surface of the semiconductor chip can be additionally conducted to prevent the occurrence of a short circuit, processing difficulties are caused when attempting to apply the insulation material only to the lower surface of the semiconductor chip while exposing the electrically connected portions, and the processing time and processing cost increase.

BRIEF SUMMARY OF THE INVENTION

An embodiment of the present invention is directed to a semiconductor chip which can prevent or at least minimize the occurrence of a short circuit when stacking semiconductor chips using through-silicon vias, and a semiconductor package including the same.

In one embodiment of the present invention, a semiconductor chip includes: a semiconductor chip body having a first surface and a second surface; a through-silicon via formed to pass through the upper surface and the lower surface of the semiconductor chip body and having a metal layer and an insulation layer which protrude from the second surface; and a silicon pattern formed on a sidewall of the protruding through-silicon via.

The silicon pattern may be formed using the same material as the semiconductor chip body.

The silicon pattern may be electrically isolated from the semiconductor chip body.

The through-silicon via may further have an upper pad which extends from the metal layer and may be formed on the semiconductor chip body.

The upper pad may have a groove which is defined by removing a partial thickness of a portion of the upper pad from a surface thereof toward the first surface of the semiconductor chip body.

A protruding length of the metal layer and a protruding length of the insulation layer may be the same.

A protruding length of the metal layer may be greater or less than a protruding length of the insulation layer.

In another embodiment of the present invention, a semiconductor package includes: a substrate having a connection pad; and at least two semiconductor chips stacked over the substrate, each semiconductor chip including a semiconductor chip body having a first surface and a second surface; a through-silicon via formed to pass through the upper surface and the lower surface of the semiconductor chip body and having a metal layer and an insulation layer which protrude from the second surface; and a silicon pattern formed on a sidewall of the protruding through-silicon via, wherein the stacked semiconductor chips are electrically connected by the medium of junction metals which are interposed between upper and lower semiconductor chips.

The silicon pattern may be formed using the same material as the semiconductor chip body.

The silicon pattern may be electrically isolated from the semiconductor chip body.

A protruding length of the metal layer and a protruding length of the insulation layer may be the same.

A protruding length of the metal layer may be greater or less than a protruding length of the insulation layer.

The through-silicon via further may have an upper pad which extends from the metal layer and may be formed on the semiconductor chip body.

The upper pad may have a groove which is defined by removing a partial thickness of a portion of the upper pad from a surface thereof toward the upper surface of the semiconductor chip body.

The junction metal may include a solder.

The substrate and a lowermost semiconductor chip may be electrically connected to each other by the medium of a junction metal which is interposed between the connection pad of the substrate and the through-silicon via of the lowermost semiconductor chip.

The stacked semiconductor chips may be attached such that first surfaces or second surfaces of the respective semiconductor chips face the surface of the substrate on which the.

The semiconductor package may further include an underfill member filling spaces between the stacked semiconductor chips and a space between the substrate and the lowermost semiconductor chip.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention. It should be noted that directions and references (e.g., upper surface, lower surface, top, bottom, etc.) may be used to facilitate the discussion of the drawings and are not intended to restrict the breadth of application of the claims presented.

Figure 1:
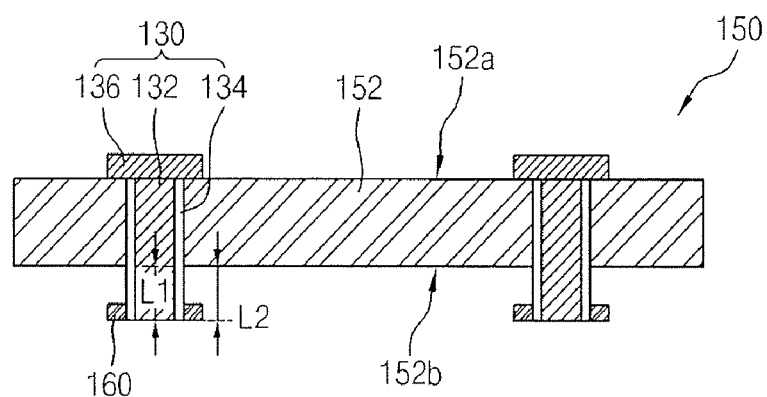
FIG. 1 is a cross-sectional view showing a semiconductor chip in accordance with an embodiment of the present invention.
Figure 2:
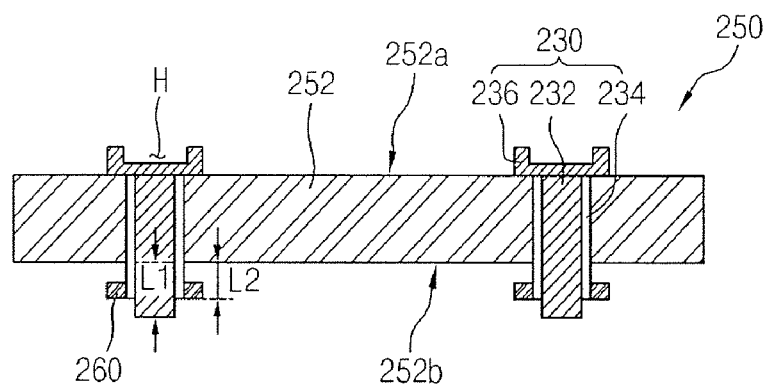
FIG. 2 is a cross-sectional view showing a semiconductor chip in accordance with another embodiment of the present invention.
Figure 3:
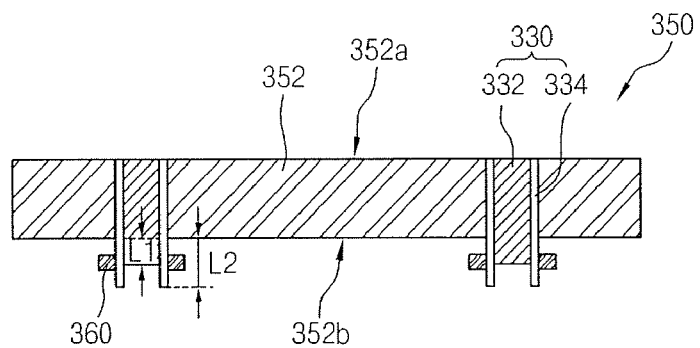
FIG. 3 is a cross-sectional view showing a semiconductor chip in accordance with another embodiment of the present invention.

FIG. 1 is a cross-sectional view showing a semiconductor chip in accordance with an embodiment of the present invention. FIG. 2 is a cross-sectional view showing a semiconductor chip in accordance with another embodiment of the present invention. FIG. 3 is a cross-sectional view showing a semiconductor chip in accordance with another embodiment of the present invention.

Referring to FIG. 1, a semiconductor chip 150 in accordance with an embodiment of the present invention includes a semiconductor chip body 152, through-silicon vias 130 and silicon patterns 160.

The semiconductor chip body 152 has an upper surface 152a on which bonding pads (not shown) are disposed and a lower surface 152b which faces away from the upper surface 152a. The semiconductor chip body 152 can further have a circuit unit (not shown) connected to the bonding pads. While not shown in a drawing, the circuit unit can include a data storage section for storing data and a data processing section for processing the data stored in the data storage section.

The through-silicon vias 130 are formed to pass through the upper surface 152a and the lower surface 152b of the semiconductor chip body 152. The through-silicon vias comprise metal layers 132 and insulation layers 134 which partially protrude from the lower surface 152b of the semiconductor chip body 152. The through-silicon vias 130 can include upper pads 136 formed on the upper surface 152a of the semiconductor body. An upper pad 136 may extend over one end of the metal layer 132 and the upper surface 152a of the semiconductor chip body 152 outside of the through-silicon via 130. The upper pads 136 can be formed integrally with the metal layers 132 of the through-silicon vias 130 or can be formed as a different layer using, for example, the same material as the through-silicon vias 130.

Referring to FIG. 2, in another embodiment of the present invention, upper pads 236 can have grooves H which are defined by removing a partial thickness of the upper pads 236 from a portion of the surfaces thereof in the direction toward the upper surface 252a of the semiconductor chip body 252. In an embodiment, the grooves H may be defined to have a depth greater than one half of the thickness of the upper pads 236.

Referring again to FIG. 1, the silicon patterns 160 are formed on the sidewalls of the protruding portion of the through-silicon vias 130. Accordingly, the silicon patterns 160 can be formed to contact the sidewalls of the insulation layers 134 which protrude from the lower surface 152b of the semiconductor chip body 152.

In an embodiment, the silicon patterns 160 may be formed using the same material as the semiconductor chip body 152. For example, the silicon patterns 160 can be formed using portions of the semiconductor chip body 152. The silicon patterns 160 and the semiconductor chip body 152 are separated from each other by a predetermined distance to be electrically isolated from each other.

Referring still to FIG. 1, in an embodiment, the protruding length L1 of the metal layers 132 and the protruding length L2 of the insulation layers 134 can be the same. Referring to FIG. 2, in another embodiment of the present invention, the protruding length L1 of the metal layers 232 can be greater than the protruding length L2 of the insulation layers 234. Referring to FIG. 3, in still another embodiment of the present invention, the protruding length L1 of the metal layers 332 can be less than the protruding length L2 of the insulation layers 334.

Figure 4:
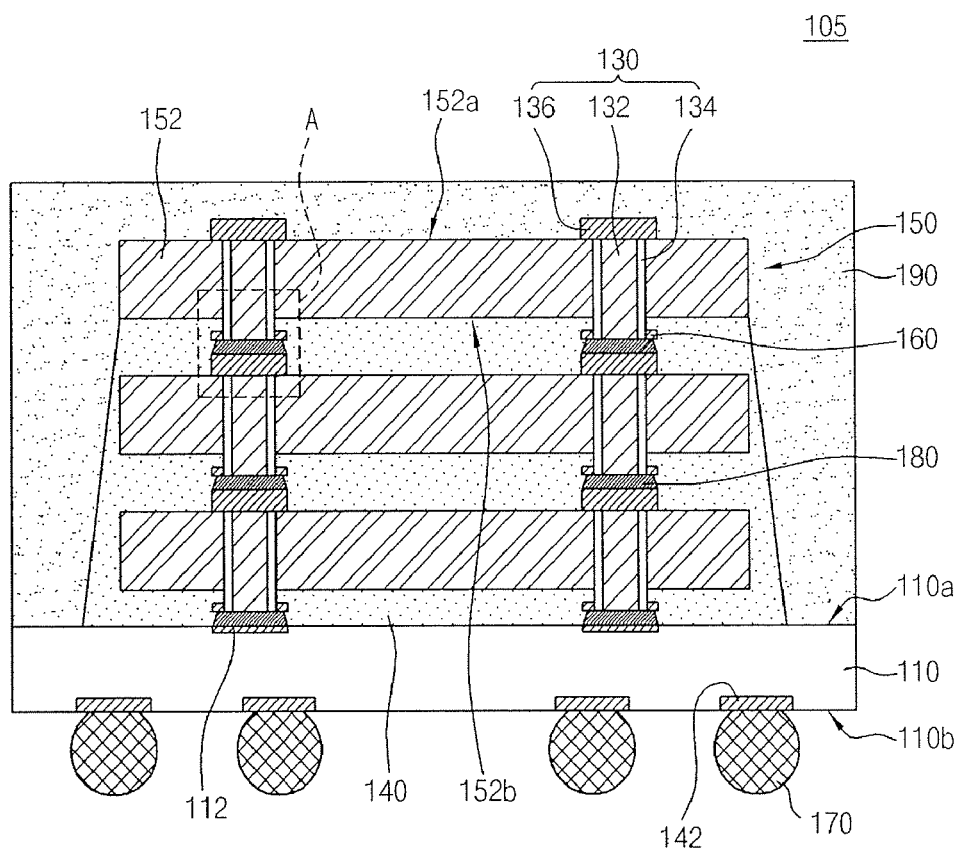
FIG. 4 is a cross-sectional view showing a semiconductor package in accordance with another embodiment of the present invention.
Figure 5:
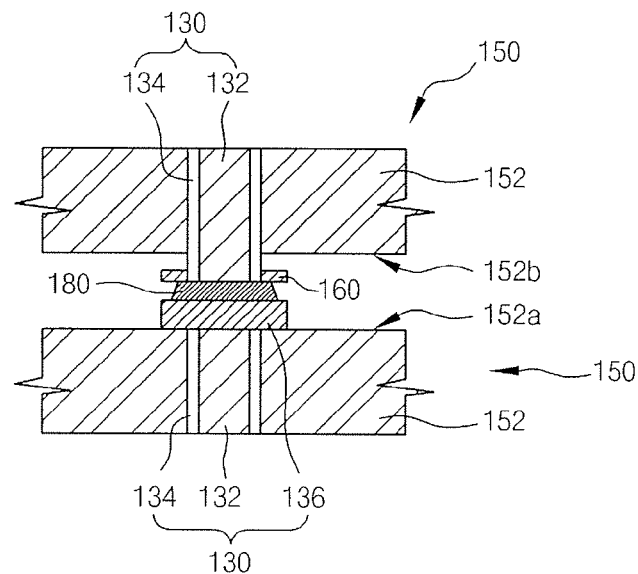
FIG. 5 is an enlarged cross-sectional view of part A of FIG. 4.

FIG. 4 is a cross-sectional view showing a semiconductor package in accordance with another embodiment of the present invention. FIG. 5 is an enlarged cross-sectional view of part A of FIG. 4.

Referring to FIG. 4, a semiconductor package 105 in accordance with another embodiment of the present invention includes a substrate 110, at least two stacked semiconductor chips 150, and an encapsulation member 190. The semiconductor package 105 can further include external connection terminals 170.

The substrate 110 has an upper surface 110a and a lower surface 110b which faces away from the upper surface 110a. Further, the substrate 110 has circuit patterns (not shown) including connection pads 112 which are disposed on the upper surface 110a and ball lands 142 which are disposed on the lower surface 110b.

Each of the semiconductor chips 150 includes a semiconductor chip body 152 having an upper surface 152a on which bonding pads (not shown) are disposed and a lower surface 152b which faces away from the upper surface 152a, through-silicon vias 130 comprising metal layers 132 and insulation layers 134 which are formed to pass through the upper surface 152a and the lower surface 152b of the semiconductor chip body 152 and protrude from the lower surface 152b of the semiconductor chip body 152, and silicon patterns 160 formed on the sidewalls of the protruding portion of the through-silicon vias 130.

The semiconductor chip 150 can further include therein a circuit unit (not shown) which is connected to the bonding pads. While not shown in a drawing, the circuit unit can include a data storage section for storing data and a data processing section for processing the data stored in the data storage section.

The through-silicon vias 130 are formed to pass through the upper surface 152a and the lower surface 152b of the semiconductor chip body 152, and protrude from the lower surface 152b of the semiconductor chip body 152 by a partial thickness. The through-silicon vias 130 include the metal layers 132 and the insulation layers 134. In an embodiment, the protruding length of the metal layers 132 and the protruding length of the insulation layers 134 can be the same.

The through-silicon vias 130 can further include upper pads 136 which are formed on the upper surface 152a of the semiconductor chip body 152 and may extend over one end of the through-silicon vias 130 to the upper surface 152a of the semiconductor chip body 152 outside of the through-silicon via 130. In an embodiment, the upper pads 136 may have grooves H which are defined by removing a partial thickness of the upper pads 136 from a portion of the surfaces thereof in the direction toward the upper surface 152a of the semiconductor chip body 152. The grooves H may be defined to have a depth greater than one half of the thickness of the upper pads 136.

The semiconductor package 105 further includes junction metals 180 which are interposed between the connection pads 112 of the substrate 110 and the through-silicon vias 130 of the lowermost semiconductor chip 150 and between the through-silicon vias 130 of the stacked semiconductor chips 150. The junction metals 180 can include, for example, solders.

Further, the semiconductor package 105 can include an underfill member 140 which fills the spaces between the stacked semiconductor chips 150 and the space between the substrate 110 and the lowermost semiconductor chip 150 among the stacked semiconductor chips 150.

In an embodiment, the stacked semiconductor chips 150 are attached in such a manner that the lower surfaces 152b of the respective semiconductor chip bodies 152 face the upper surface 110a of the substrate 110. In another embodiment, the stacked semiconductor chips 150 can be attached in such a manner that the upper surfaces 152a of the respective semiconductor chip bodies 152 face the upper surface 110a of the substrate 110.

The encapsulation member 190 is formed to seal the upper surface 110a of the substrate 110 including the stacked semiconductor chips 150. The encapsulation member 190 can include, for example, an EMC (epoxy molding compound).

The external connection terminals 170 can be attached to the ball lands 142 disposed on the lower surface 110b of the substrate 110. The external connection terminals 170 can include, for example, solder balls.

Referring to FIG. 5, in the semiconductor package 105 in accordance with an present embodiment of the invention, in order to electrically connect the through-silicon vias 130 of the semiconductor chips 150 which are vertically stacked, a reflow process is conducted using the junction metals 180.

The silicon patterns 160 of the respective semiconductor chips 150 are disposed on the sidewalls of the protruding portion of the through-silicon vias 130, and prevent melted junction metals 180 from flowing into the lower surfaces 152b of the semiconductor chip bodies 152.

The silicon patterns 160 function to extend the paths through which the melted junction metals 180 flow during the reflow process. Accordingly, the silicon patterns 160 prevent the junction metals 180 from flowing onto the lower surfaces 152b of an upwardly disposed semiconductor chip body 152 after the semiconductor chips 150 are stacked.

In a conventional semiconductor package having a through-silicon via, when conducting a reflow process, junction metals are not prevented from flowing onto the lower surface of the semiconductor chip body.

However, in the embodiment of the present invention, even when the junction metals 180, which are disposed on the downwardly disposed semiconductor chips 150, are in a melted state and are compressed by a force applied thereto when stacking the semiconductor chips 150, since the silicon patterns 160 are formed on the sidewalls of the through-silicon vias 130 of the respective semiconductor chips 150, it is possible to prevent melted junction metals 180 from flowing into the lower surfaces 152b of the upwardly disposed semiconductor chip bodies 152.

Hence, when stacking the upper and lower semiconductor chips 150, it is possible to prevent unwanted portions of the upper and lower semiconductor chips 150 from being electrically short-circuited by the melted junction metals 180, whereby it is possible to increase the manufacturing yield. Moreover, due to the adoption of the silicon patterns 160, the amount of the junction metal 180 used can be increased when compared to the conventional art, whereby the reliability of electrical connections can be improved.

In an embodiment, the silicon patterns 160 can be formed using the same material as the semiconductor chip body 152. For example, the silicon patterns 160 can be formed using portions of the semiconductor chip body 152. The silicon patterns 160 and the semiconductor chip body 152 are separated from each other by a predetermined distance in order to be electrically isolated from each other.

While not shown in a drawing, the silicon patterns 160 can be formed through conducting at least one of a back grinding process and an etching process for the lower surfaces 152b of the semiconductor chip bodies 152.

That is to say, the silicon patterns 160 can be formed in such a manner that, after primarily removing a partial thickness through back-grinding the lower surfaces 152b of the semiconductor chip bodies 152, parts of the semiconductor chip bodies 152 except the sidewalls of the through-silicon vias 130 are secondarily removed through conducting a selective etching process using a photolithographic process. When secondarily removing the semiconductor chip bodies 152, the silicon patterns 160 composed of the portions of the semiconductor chip bodies 152 are selectively left on the sidewalls of the protruding portions of the through-silicon vias 130 in such a manner that the silicon patterns 160 and the semiconductor chip bodies 152 are separated by the predetermined distance to be electrically isolated from each other.

Figure 6:
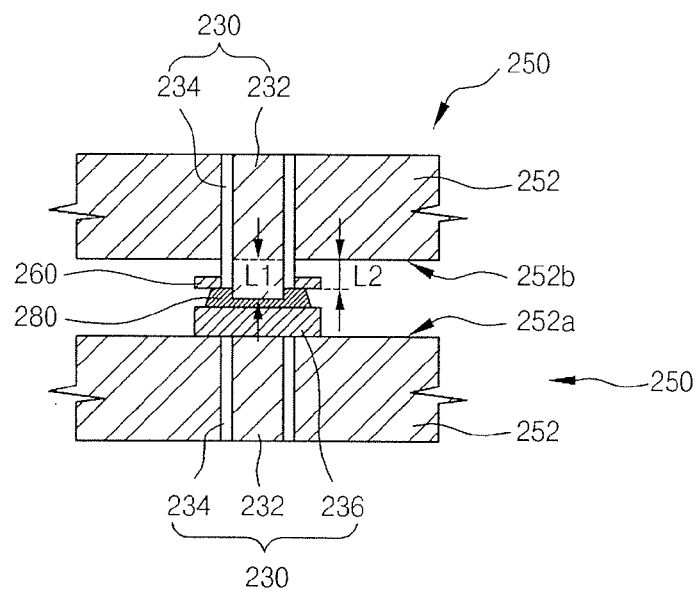
FIG. 6 is an enlarged cross-sectional view partially illustrating a semiconductor package in accordance with another embodiment of the present invention.
Figure 7:
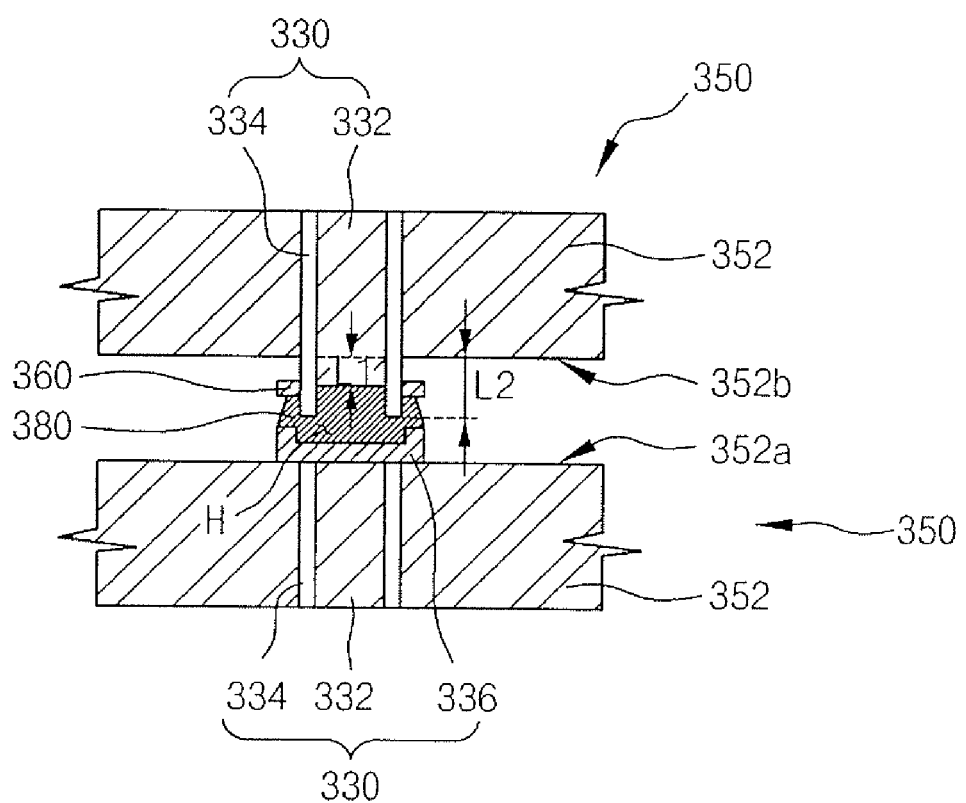
FIG. 7 is an enlarged cross-sectional view partially illustrating a semiconductor package in accordance with another embodiment of the present invention.

FIG. 6 is an enlarged cross-sectional view partially illustrating a semiconductor package in accordance with another embodiment of the present invention. FIG. 7 is an enlarged cross-sectional view partially illustrating a semiconductor package in accordance with another embodiment of the present invention.

Referring to FIG. 6, in a semiconductor package in accordance with another embodiment of the present invention, a protruding length L1 of metal layers 232 can be greater than a protruding length L2 of insulation layers 234. In this case, the contact area between the metal layers 232 and junction metals 280 is increased, and the path through which the junction metals 280 should flow to reach the lower surface 252b of a semiconductor chip body 252 is extended.

Referring to FIG. 7, in a semiconductor package in accordance with still another embodiment of the present invention, a protruding length L1 of metal layers 332 can be less than a protruding length L2 of insulation layers 334. In this case, since the protruding portions of the insulation layers 334 surround the protruding portions of the metal layers 332, electrical connections can be formed in such a manner that junction metals 380 are inserted into the protruding portions of the insulation layers 334 which surround the protruding portions of the metal layers 332.

Further, upper pads 336 can have grooves H which are defined by removing a partial thickness of the upper pads 336 from a portion of the surfaces thereof in the direction toward an upper surface 352a of a semiconductor chip body 352. In this case, since the junction metals 380 are introduced into the grooves H of the upper pads 336, it is possible to prevent unwanted portions of upper and lower semiconductor chips 350 from being short-circuited.

As a result, the embodiments shown in FIGS. 6 and 7 have structures which are even more effective in preventing the occurrence of a short circuit between upper and lower semiconductor chips than the embodiment shown in FIG. 5.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip comprising:
   a semiconductor chip body having a first surface and a second surface facing away from the first surface;
   a through-silicon via formed to pass through the semiconductor chip body, a portion of the through-silicon via protruding from the second surface of the semiconductor chip body, and the through silicon via comprising a metal layer and an insulation layer; and
   a silicon pattern formed on a portion of a sidewall of the portion of the through-silicon via protruding from the second surface.

2. The semiconductor chip according to claim 1, wherein the silicon pattern is formed of the same material as the semiconductor chip body.

3. The semiconductor chip according to claim 1, wherein the silicon pattern is electrically isolated from the semiconductor chip body.

4. The semiconductor chip according to claim 1, wherein the through-silicon via further comprises an upper pad which extends from the metal layer and is formed on the semiconductor chip body.

5. The semiconductor chip according to claim 4, wherein the upper pad has a groove defined by removing a partial thickness of a portion of the upper pad from a surface thereof toward the first surface of the semiconductor chip body.

6. The semiconductor chip according to claim 1, wherein a length the metal layer protrudes from the second surface and a length the insulation layer protrudes from the second surface are the same.

7. The semiconductor chip according to claim 1, wherein a length the metal layer protrudes from the second surface is greater or less than a length the insulation layer protrudes from the second surface.

8. A semiconductor package comprising:
   a substrate comprising a connection pad; and
   at least two semiconductor chips stacked over the substrate,
      each semiconductor chip comprising
      a semiconductor chip body having a first surface and a second surface facing away from the first surface;
      a through-silicon via formed to pass through the semiconductor chip body, a portion of the through-silicon via protruding from the second surface of the semiconductor chip body, and the through-silicon via comprising a metal layer and an insulation layer; and
      a silicon pattern formed on a portion of a sidewall of the portion of the through-silicon via protruding from the second surface,
   wherein the stacked semiconductor chips are electrically connected by the medium of a junction metal which is interposed between adjacent semiconductor chips of the at least two semiconductor chips.

9. The semiconductor package according to claim 8, wherein the silicon pattern is formed using the same material as the semiconductor chip body.

10. The semiconductor package according to claim 8, wherein the silicon pattern is electrically isolated from the semiconductor chip body.

11. The semiconductor package according to claim 8, wherein a length the metal layer protrudes from the second surface and a length the insulation layer protrudes from the second surface are the same.

12. The semiconductor package according to claim 8, wherein a length the metal layer protrudes from the second surface is greater or less than a length the insulation layer protrudes from the second surface.

13. The semiconductor package according to claim 8, wherein the through-silicon via further comprises an upper pad which extends from the metal layer and is formed on the semiconductor chip body.

14. The semiconductor package according to claim 13, wherein the upper pad has a groove defined by removing a partial thickness of a portion of the upper pad from a surface thereof toward the first surface of the semiconductor chip body.

15. The semiconductor package according to claim 8, wherein the junction metal comprises solder.

16. The semiconductor package according to claim 8, wherein the substrate and a lowermost semiconductor chip are electrically connected to each other by the medium of a junction metal which is interposed between the connection pad of the substrate and the through-silicon via of the lowermost semiconductor chip.

17. The semiconductor package according to claim 8, wherein the stacked semiconductor chips are attached such that the first surfaces or the second surfaces of the respective semiconductor chips face a surface of the substrate on which the connection pad is formed.

18. The semiconductor package according to claim 8, further comprising:

an underfill member filling spaces between the stacked semiconductor chips and a space between the substrate and a lowermost semiconductor chip of the at least two semiconductor chips.

* * * * *